(12) United States Patent
Fang et al.

(10) Patent No.: US 11,411,544 B2
(45) Date of Patent: Aug. 9, 2022

(54) PHASE SHIFTER AND ANTENNA

(71) Applicant: BOE TECHNOLOGY GROUP CO., LTD., Beijing (CN)

(72) Inventors: Jia Fang, Beijing (CN); Hai Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 50 days.

(21) Appl. No.: 17/258,800

(22) PCT Filed: Mar. 24, 2020

(86) PCT No.: PCT/CN2020/080840
§ 371 (c)(1),
(2) Date: Jan. 8, 2021

(87) PCT Pub. No.: WO2021/189238
PCT Pub. Date: Sep. 30, 2021

(65) Prior Publication Data
US 2022/0140800 A1     May 5, 2022

(51) Int. Cl.
*H03H 7/18*       (2006.01)
*H01Q 9/04*      (2006.01)
(Continued)

(52) U.S. Cl.
CPC ............ *H03H 7/18* (2013.01); *H01P 1/18* (2013.01); *H01P 1/184* (2013.01); *H01Q 3/34* (2013.01); *H01Q 9/0407* (2013.01)

(58) Field of Classification Search
CPC .......... H03H 7/18; H01Q 9/0407; H01Q 3/36; H01Q 3/34; H01P 1/18; H01P 1/184
See application file for complete search history.

(56) References Cited

U.S. PATENT DOCUMENTS 10,141,620 B2     11/2018   Jakoby et al.
2014/0022029 A1   1/2014    Glushchenko et al.
(Continued)

FOREIGN PATENT DOCUMENTS

CN    105308789 A    2/2016
CN    108808181 A    11/2018
(Continued)

OTHER PUBLICATIONS

China Patent Office, First Office Action dated Jan. 13, 2022, for corresponding Chinese application No. 202080000349.9.

*Primary Examiner* — Daniel D Chang
(74) *Attorney, Agent, or Firm* — Houtteman Law LLC

(57) ABSTRACT

The present disclosure provides a phase shifter including: a first substrate and a second substrate. The first substrate includes a reference electrode and a signal electrode, and the signal electrode includes a main structure and multiple branch structures. The second substrate includes multiple patch electrodes, and the multiple patch electrodes are arranged in a one-to-one correspondence with the multiple branch structures to form multiple variable capacitors. The phase shifter has a first region, and a second region and a third region which are respectively provided on two sides of the first region; and for any two of variable capacitors located on a same side of the first region, an overlap area of patch electrode and branch structure of a variable capacitor close to the first region is greater than or equal to that of a variable capacitor away from the first region.

20 Claims, 5 Drawing Sheets

(51) Int. Cl.
*H01P 1/18* (2006.01)
*H01Q 3/34* (2006.01)

(56) References Cited

U.S. PATENT DOCUMENTS

| | | | |
|---|---|---|---|
| 2015/0380789 A1* | 12/2015 | Jakoby | H01P 1/181 343/905 |
| 2020/0203827 A1 | 6/2020 | Wang et al. | |
| 2021/0135327 A1 | 5/2021 | Wang et al. | |
| 2022/0052429 A1 | 2/2022 | Kong et al. | |

FOREIGN PATENT DOCUMENTS

| | | |
|---|---|---|
| CN | 109193081 A | 1/2019 |
| CN | 208818972 U | 5/2019 |
| CN | 110518311 A | 11/2019 |
| CN | 110632615 A | 12/2019 |
| CN | 110707397 A | 1/2020 |
| CN | 110824734 A | 2/2020 |
| EP | 0615250 A1 | 9/1994 |

* cited by examiner

PHASE SHIFTER AND ANTENNA

CROSS-REFERENCE TO RELATED APPLICATIONS

The present application is a US National Stage of International Application No. PCT/CN2020/080840, filed on Mar. 24, 2020, which is hereby incorporated by reference in its entirety.

TECHNICAL FIELD

The present disclosure relates to the field of communication technology, more particularly, to a phase shifter and an antenna.

BACKGROUND

A current liquid crystal phase shifter structure introduces a periodic chip capacitor load on an upper glass substrate of a box. The adjustment of a variable capacitor is to drive the deflection of liquid crystal molecules by adjusting a difference of voltages applied to two metal plates on different planes to obtain different liquid crystal material characteristics corresponding to different capacitance values. A coplane waveguide (CPW) structure is easier to connect and design, because a ground electrode and a signal electrode are in a same plane, so it can save the functional requirement of glass punching.

SUMMARY

The present disclosure aims to solve at least one of the technical problems existing in the prior art, and provides a phase shifter and an antenna.

In a first aspect, embodiments of the present disclosure provide a phase shifter, including: a first substrate and a second substrate arranged opposite each other, and a medium layer arranged between the first substrate and the second substrate; wherein the first substrate includes: a first base substrate, and a reference electrode and a signal electrode which are arranged on a side of the first base substrate close to the medium layer; and the signal electrode includes: a main structure and a plurality of branch structures connected to the main structure along a length direction of the main structure; the second substrate includes: a second base substrate, a plurality of patch electrodes arranged on a side of the second base substrate close to the medium layer; the plurality of patch electrodes are arranged in a one-to-one correspondence with the plurality of branch structures to form a plurality of variable capacitors; and an orthographic projection of each of the plurality of patch electrodes on the first base substrate at least partially overlaps with an orthographic projection of the reference electrode on the first base substrate; the phase shifter has a first region, and a second region and a third region which are respectively provided on two sides of the first region; wherein each variable capacitor located in the second and third regions has a smaller overlap area of patch electrode and branch structure than a variable capacitor located in the first region, and the variable capacitor located in the first region has only one kind of overlap area; and when the second region has multiple variable capacitors and the third region has multiple variable capacitors, for any two of variable capacitors located on a same side of the first region, a variable capacitor close to the first region has a greater overlap area of patch electrode and branch structure than a variable capacitor away from the first region, or has a same overlap area of patch electrode and branch structure as the variable capacitor away from the first region.

Optionally, the reference electrode includes: a first sub-reference electrode and a second sub-reference electrode; the signal electrode is arranged between the first sub-reference electrode and the second sub-reference electrode; and the orthographic projection of each of the plurality of patch electrodes on the first base substrate at least partially overlaps with an orthographic projection of the first sub-reference electrode on the first base substrate and an orthographic projection of the second sub-reference electrode on the first base substrate.

Optionally, the variable capacitors located in the second region have different overlap areas of patch electrode and branch structure; and/or the variable capacitors located in the third region have different overlap areas of patch electrode and branch structure.

Optionally, the number of the variable capacitors located in the second region is a same as the number of the variable capacitors located in the third region, and the variable capacitors located in the second region and the variable capacitors located in the third region are symmetrically arranged with reference to the first region.

Optionally, the variable capacitors located in the second region have monotonically increased overlap areas of patch electrode and branch structure, along a direction towards the first region; and/or the variable capacitors located in the third region have monotonically increased overlap areas of patch electrode and branch structure, along a direction towards the first region.

Optionally, the first region has only one variable capacitor, and a phase shift degree of the phase shifter is greater than or equal to 360°.

Optionally, the first region has multiple variable capacitors, and a phase shift degree of the phase shifter is greater than or equal to 360°.

Optionally, the plurality of branch structures have a same width; or the plurality of branch structures have a same length.

Optionally, any two adjacent variable capacitors have a same spacing.

Optionally, the plurality of branch structures penetrate the main structure.

Optionally, the plurality of branch structures and the main structure are integrally formed.

Optionally, the reference electrode is a ground electrode.

Optionally, the medium layer includes liquid crystal molecules.

In a second aspect, embodiments of the present disclosure provide an antenna including the above-mentioned phase shifter.

Optionally, the antenna further includes at least two patch units arranged on a side of the second base substrate away from the medium layer, and a gap between two patch units corresponds to a gap between two patch electrodes.

Optionally, the at least two patch units are in contact with the second base substrate.

DETAILED DESCRIPTION

To make those skilled in the art better understand the technical solutions of the present disclosure, the present disclosure will be further described in detail below in conjunction with the accompanying drawings and embodiments.

Unless otherwise defined, the technical terms or scientific terms used in the present disclosure shall have the usual meanings understood by those with ordinary skills in the field to which this disclosure belongs. The "first", "second" and other similar words used in the present disclosure do not indicate any order, quantity, or importance, but are only used to distinguish different components. Similarly, the "a", "one", "the" or another similar word does not mean quantity limitation, but means that there is at least one. The "include", "comprise" or another similar word means that an element or item appearing in front of the word encompasses an element or item listed behind the word, and its equivalents, but does not exclude other elements or items. The "connected to", "coupled to" or other similar words are not limited to physical or mechanical connections, but may include electrical connections, whether directly or indirectly. The "upper", "lower", "left", "right", etc. are only used to indicate relative position relationships. When an absolute position of a described object changes, a relative position relationship may also change accordingly.

Figure 1:
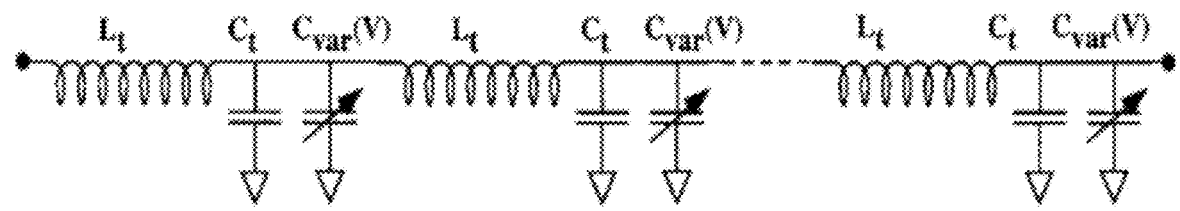
FIG. 1 is an equivalent model of a transmission line periodically loaded with variable capacitors in parallel.

It should be noted here that a transmission line is periodically loaded with variable capacitors in parallel, and the phase can be changed by changing capacitances of the variable capacitors. An equivalent model is shown in FIG. 1. In FIG. 1, Lt and Ct represent an equivalent line inductance and line capacitance of the transmission line, which depend on the characteristics of the transmission line and the substrate. The variable capacitor Cvar(V) can be realized by a Micro-Electro-Mechanical System (MEMS) capacitor, or a variable diode capacitor, etc. At present, a capacitance value of a plate capacitor is changed by voltage-controlled liquid crystal, thereby manufacturing a liquid crystal phase shifter.

Figure 2:
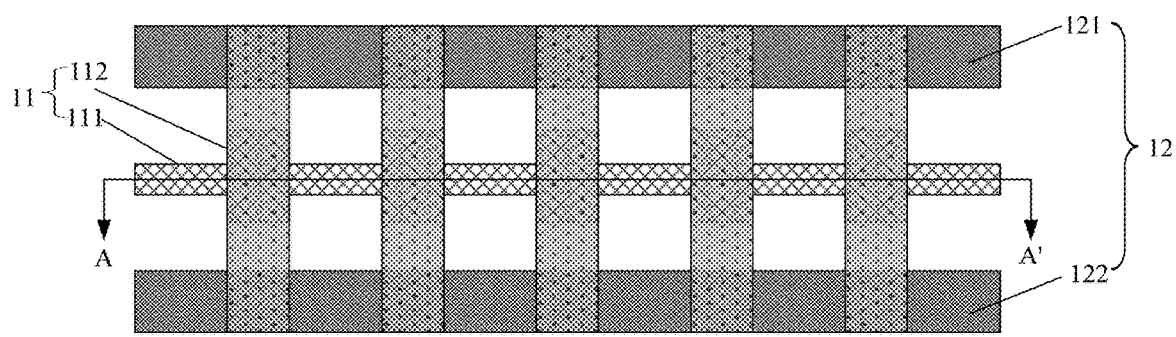
FIG. 2 is a top view of a phase shifter.
Figure 3:
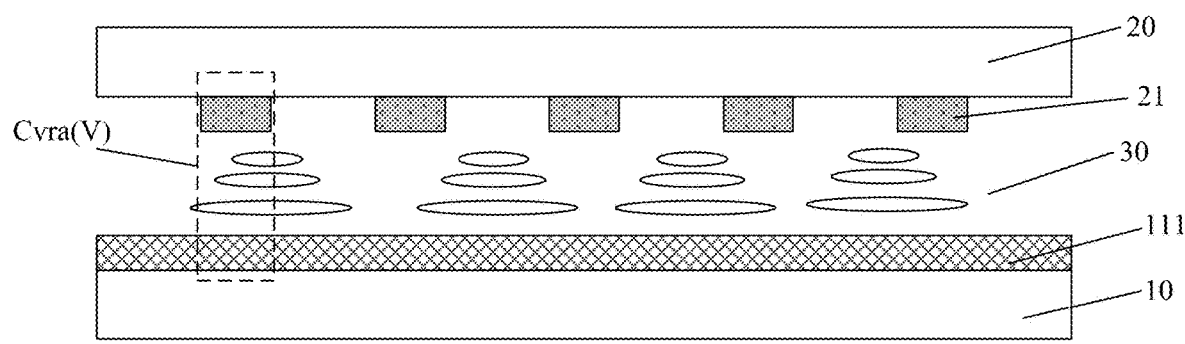
FIG. 3 is a cross-sectional view taken along the line A-A' of FIG. 2.

FIGS. 2 and 3 show an exemplary CPW structure of the liquid crystal phase shifter, and the equivalent circuit diagram is also shown in FIG. 1. The liquid crystal phase shifter includes a first substrate and a second substrate arranged opposite each other, and a liquid crystal layer 30 arranged between the first substrate and the second substrate.

The first substrate includes a first base substrate 10, and a ground electrode 12 and a signal electrode 11 which are arranged on a side of the first base substrate 10 close to the liquid crystal layer 30. The ground electrode 12 includes a first sub-ground electrode 121 and a second sub-ground electrode 122, and the signal electrode 11 is arranged between the first sub-ground electrode 121 and the second sub-ground electrode 122. The signal electrode 11 includes a main structure 111 that extends in the same direction as the first sub-ground electrode 121 and the second sub-ground electrode 122, and a plurality of branch structures 112 connected to the main structure and arranged at intervals along a length direction of the main structure 111.

Figure 4:
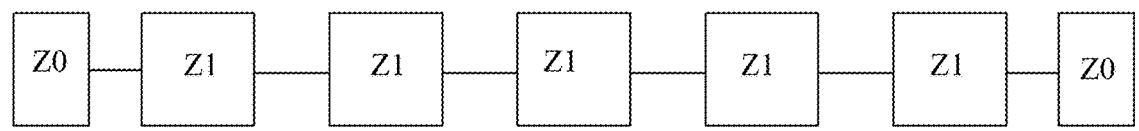
FIG. 4 is a schematic diagram of impedance changes of the phase shifter shown in FIG. 2.

The second substrate includes a second base substrate 20, and a plurality of patch electrodes 21 arranged on a side of the second base substrate 20 close to the liquid crystal layer 30, an extension direction of the patch electrodes 21 is the same as an extension direction of the branch structures 112 of the signal electrode 11, and the patch electrodes 21 and the branch structures 112 are arranged in one-to-one correspondence respectively. At the same time, orthographic projections of each patch electrode 21 and the corresponding branch structure 112 on the base substrate, as well as orthographic projections of the first sub-ground electrode 121 and the second sub-ground electrode 122 on the base substrate at least partially overlap, to form a current loop. Overlap areas of the variable capacitors Cvra (V) formed in this phase shifter are the same, and thus when a same voltage is applied to the plurality of patch electrodes 21, an equivalent impedance of each formed variable capacitor Cvra (V) is also the same. As shown in FIG. 4, the impedance of each variable capacitor Cvra(V) is Z1. It should be noted here that Z0 represents an impedance value formed between a signal lead-in end of the signal electrode 11 and the ground electrode 12.

In order to use the CPW periodically loaded variable capacitor Cvra(V) structure for a phased array antenna to realize a beam scanning function, it is required that a phase difference adjustable range of each phase shifter must be greater than 360°. Therefore, in order to achieve this value, placing and reasonably arranging phase shifters in a limited area requires that an overall length of the phase shifters should not be too long, and thus the value of the variable capacitor Cvra(V) in each cycle must be large enough, thereby realizing the phase difference within a finite length. However, if the variable capacitor Cvra(V) has a large change value, it will inevitably cause a large change in the equivalent impedance of the transmission line, and a great problem is that port performance deteriorates, which increases the transmission loss.

To solve the above problems, the embodiments of the present disclosure provide the following technical solutions. Before introducing the technical solutions of the embodiments of the present disclosure, it should be noted that a medium layer in the phase shifter provided below includes but is not limited to the liquid crystal layer 30, and a reference electrode includes but is not limited to the ground electrode 12. Correspondingly, a first sub-reference electrode and a second sub-reference electrode are also used to connect the ground signal, and for the convenience of description, they are represented by the first sub-ground electrode 121 and the second sub-ground electrode 122 respectively. In the following description, taking the medium layer as the liquid crystal layer 30, the reference electrode as the ground electrode 12, and the first sub-reference electrode and the second sub-reference electrode as the first sub-ground electrode 121 and the second sub-ground electrode 122, respectively, to describe.

In a first aspect, as shown in FIGS. 5-9, embodiments of the present disclosure provide a phase shifter, which includes: a first substrate and a second substrate arranged opposite each other, and a liquid crystal layer 30 arranged between the first substrate and the second substrate.

The first substrate includes: a first base substrate 10, and a ground electrode 12 and a signal electrode 11 which are arranged on a side of the first base substrate 10 close to the medium layer; and the signal electrode 11 includes: a main structure 111 and a plurality of branch structures 112 connected to the main structure 111 along a length direction of the main structure 111.

The second substrate includes: a second base substrate 20, and a plurality of patch electrodes 21 arranged on a side of the second base substrate 20 close to the medium layer; the plurality of patch electrodes 21 are arranged in a one-to-one correspondence with the plurality of branch structures 112 to form a plurality of variable capacitors Cvra(V); and an orthographic projection of each patch electrode 21 on the first base substrate 10 at least partially overlaps with an orthographic projection of the reference electrode on the first base substrate 10. When a microwave signal is input to the main structure 111, the ground electrode 12, the main structure 111, a branch structure 112, and a patch electrode 21 form a current loop.

Figure 5:
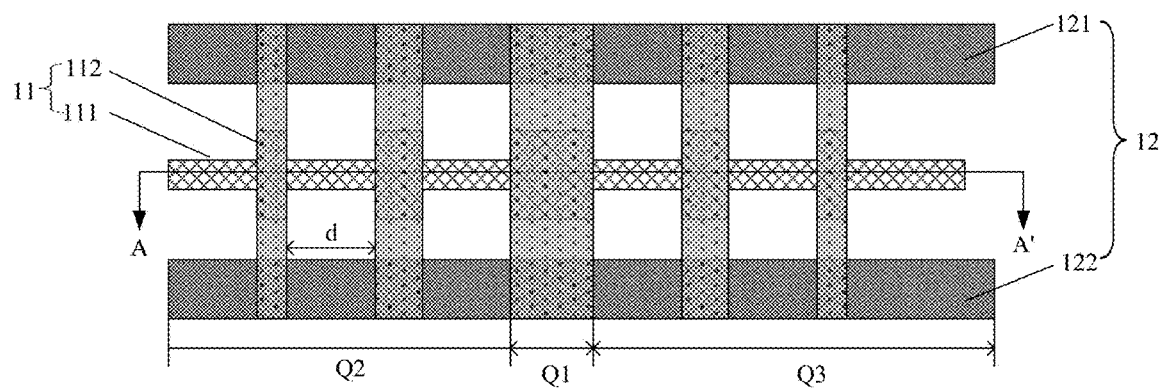
FIG. 5 is a top view of a phase shifter according to an embodiment of the present disclosure.

In the embodiments of the present disclosure, the phase shifter may be divided into a first region Q1, and a second region Q2 and a third region Q3 which are respectively provided on two sides of the first region Q1 (i.e., as shown in FIG. 5, the phase shifter is divided into the second region Q2, the first region Q1, and the third region Q3 from left to right). Each variable capacitor Cvra(V) located in the second region Q2 and third region Q3 has a smaller overlap area of patch electrode 21 and branch structure 112 than a variable capacitor Cvra(V) located in the first region Q1, and there is only the variable capacitor Cvra(V) with one kind of overlap area in the first region Q1.

When the number of variable capacitors Cvra(V) located in the second region Q2 and the number of variable capacitors Cvra(V) located in the third region Q3 are both multiple, for any two of variable capacitors Cvra(V) located on a same side of the first region Q1, the overlap area of patch electrode 21 and branch structure 112 of a variable capacitor Cvra(V) close to the first region Q1 is greater than or equal to the overlap area of patch electrode 21 and branch structure 112 of a variable capacitor Cvra(V) away from the first region Q1.

It should be noted here that the overlap area refers to an area of an overlapping region of orthographic projections of the patch electrode 21 and the branch structure 112 on the first base substrate 10 (or the second base substrate 20).

Figure 9:
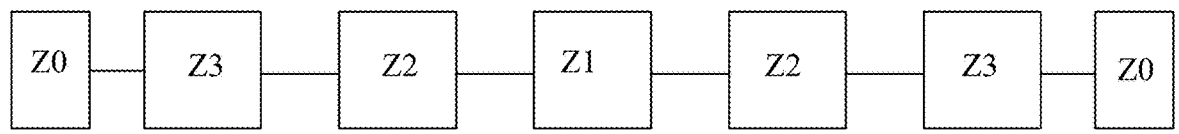
FIG. 9 is a schematic diagram of impedance changes of the phase shifter shown in FIG. 5.

In the embodiments of the present disclosure, since there is a certain overlap between the patch electrode 21 and the branch structure 112, when a microwave signal is input to the main structure 111, there is a certain voltage difference between voltages applied to the patch electrode 21 and the branch structure 112, so that a dielectric constant of the liquid crystal layer 30 in the liquid crystal capacitor formed by the overlap of the patch electrode 21 and the signal electrode 11 is changed to change a phase of the microwave signal. Further, in the embodiments of the present disclosure, for any two of variable capacitors Cvra(V) located on the same side of the first region Q1, the overlap area of patch electrode 21 and branch structure 112 of the variable capacitor Cvra(V) close to the first region Q1 is greater than or equal to the overlap area of patch electrode 21 and branch structure 112 of the variable capacitor Cvra(V) away from the first region Q1; that is, along the length direction of the main structure 111, capacitance values of the formed periodic variable capacitors Cvra(V) increase first and then decrease, and the capacitance values of the variable capacitors Cvra(V) are positively correlated with the impedance values, and thus along the length direction of the main structure 111, the impedances of the phase shifter first increase and then decrease (as shown in FIG. 9, along the length direction of the main structure 111, the impedances are Z0-Z3-Z2-Z1-Z2-Z3-Z0; where Z1>Z2>Z3>Z0). At the same time, it can be understood that the microwave signal is input from both ends of the main structure 111 of the signal electrode 11. In this way, it is possible to avoid a problem that the large capacitance value of each variable capacitor Cvra(V) causes the microwave signal to be reflected after passing through the periodic variable capacitors Cvra(V), and further leads to a large transmission loss.

In some embodiments, the ground electrode 12 includes a first sub-ground electrode 121 and a second sub-ground electrode 122, and the first sub-ground electrode 121 and the second sub-ground electrode 122 restrict the main structure 111 and the branch structures 112 of the signal electrode 11 between the first sub-ground electrode 121 and the second sub-ground electrode 122; and the orthographic projection of each patch electrode 21 on the first base substrate 10 (or the second base substrate 20) at least partially overlaps with orthographic projections of the first sub-ground electrode 121 and second sub-ground electrode 122 on the first base substrate 10 (or the second base substrate 20). At this time, when the microwave signal is input to the main structure 111, the first sub-ground electrode 121, the second sub-ground electrode 122, the branch structure 112, the main structure 111, and the patch electrode 21 form a current loop.

Figure 7:
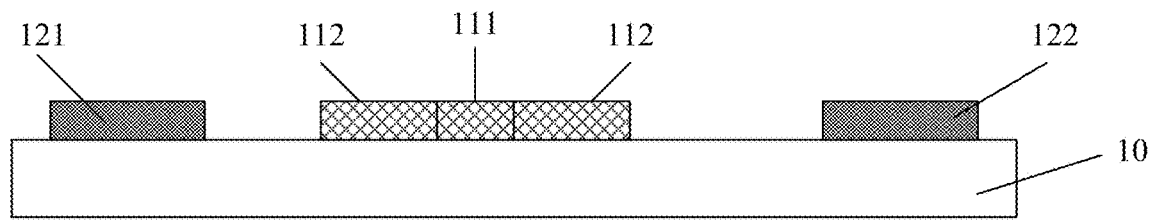
FIG. 7 is a side view of the phase shifter shown in FIG. 5.
Figure 8:
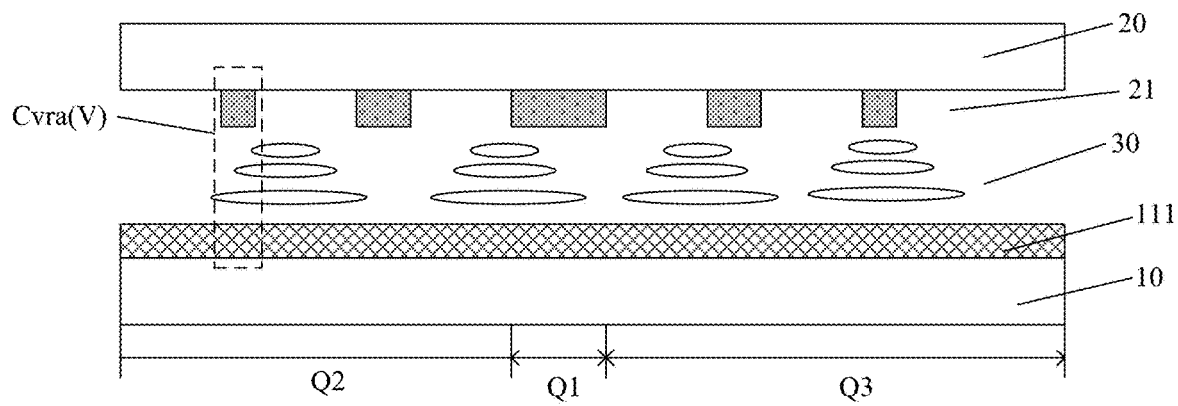
FIG. 8 is a cross-sectional view taken along the line A-A' of the phase shifter shown in FIG. 5.

In order to ensure that the microwave signal transmit smoothly, the branch structure 112 may be provided to penetrate the main structure 111 on the basis of the above structure. In some embodiments, the branch structures 112 and the main structure 111 may be designed as an integral structure; that is, as shown in FIG. 7, the branch structures 112 and the main structure 111 are arranged in a same layer and are formed by a same material. In this way, the manufacturing of the branch structures 112 and the main structure 111 is facilitated, and the process cost is reduced. Of course, the branch structures 112 and the main structure 111 may also be electrically coupled with each other in any manner, which is not limited in the embodiments of the present disclosure. At this time, when the microwave signal is input to the main structure 111, there is a certain voltage difference between the voltage applied to the patch electrode 21 and the voltage applied to the branch structure 112, so that the dielectric constant of the liquid crystal layer 30 in the liquid crystal capacitor formed by the overlap of the patch electrode 21 and the signal electrode 11 is changed to change the phase of the microwave signal.

Of course, in the embodiments of the present disclosure, the ground electrode 12 may only include one of the first sub-ground electrode 121 and the second sub-ground electrode 122. The transmission principle of the microwave signal is the same as the above principle, and the detailed description is omitted here.

In some embodiments, the number of variable capacitors Cvra (V) located in the first region Q1 is only one; that is, only one patch electrode 21 and one branch structure 112 are provided in the first region Q1, and the orthographic projections of the patch electrode 21 and the branch structure 112 on the base substrate at least partially overlap, forming a variable capacitor Cvra(V). The capacitance value of the variable capacitor Cvra(V), i.e., the overlap area of the patch electrode 21 and the branch structure 112, should satisfy that the phase shift is not less than 360° after the microwave signal passes through the first region Q1, the second region Q2, and the third region Q3.

In some embodiments, if there is one variable capacitor Cvra(V) in the first region Q1, and the phase shifter cannot achieve a phase shift of 360°, a plurality of variable capacitors Cvra(V) having a same overlap area may be provided in the first region Q1, so that after the microwave signal passes through the first region Q1, the second region Q2, and the third region Q3, the phase shift of not less than 360° can be achieved. Of course, at least one variable capacitor Cvra(V) may also be formed on position(s) in the second region Q2 and/or third region Q3 close to the first region Q1, so that after the microwave signal passes through the first region Q1, the second region Q2, and the three region Q3, the phase shift of not less than 360° can be achieved, which is not limited in the embodiments of the present disclosure, and as long as it is satisfied that for any two variable capacitors Cvra(V) located on the same side of the first region Q1, the overlap area of patch electrode 21 and branch structure 112 of the variable capacitor Cvra(V) close to the first region Q1 is greater than or equal to that of the variable capacitance Cvra (V) away from the first region Q1.

In some embodiments, overlap areas of variable capacitors Cvra(V) formed in the second region Q2 are different, and/or overlap areas of variable capacitors Cvra(V) formed in the third region Q3 are different. Preferably, in a direction towards the first region Q1, the overlap areas of the variable capacitors Cvra(V) formed in the second region Q2 increase monotonically, and the overlap areas of the variable capacitors Cvra(V) formed in the third region Q3 increase monotonically. That is, along the direction towards the first region Q1, the capacitance values of the variable capacitors Cvra (V) formed in the second region Q2 and the capacitance values of the variable capacitors Cvra(V) formed in the third region Q3 increase according to a certain rule. In this way, the microwave signal transmission is more stable, and the transmission loss is reduced as much as possible.

In some embodiments, the number of variable capacitors Cvra(V) formed in the second region Q2 and the number of variable capacitors Cvra(V) formed in the third region Q3 is the same, and the variable capacitors Cvra(V) formed in the two regions are symmetrically arranged with respect to the first region Q1. That is, the capacitance values (or overlap areas) of the variable capacitors Cvra(V) formed in the second region Q2 and that of the variable capacitors Cvra(V) formed in the third region Q3 have a same law of change along the direction towards the first region Q1. In this way, the microwave signal transmission is more stable, and the transmission loss is reduced as much as possible.

In some embodiments, as shown in FIG. 5, in order to realize that the overlap areas of the respective variable capacitors Cvra(V) are different, a length of each branch structure 112 may be set to be the same, and widths of the branch structures 112 in different variable capacitors Cvra (V) may be set to achieve that for any two variable capacitors Cvra(V) located on the same side of the first region Q1, the overlap area of patch electrode 21 and branch structure 112 of the variable capacitor Cvra(V) close to the first region Q1 is greater than or equal to that of the variable capacitance Cvra (V) away from the first region Q1.

It should be noted that a length direction of the branch structure 112 is perpendicular to the length direction of the main structure 111, and a width direction of the branch structure 112 is the same as the length direction of the main structure 111.

As shown in FIG. 5, from the second region Q2 to the first region Q1 and then to the third region Q3, lengths of the respective branch structures 112 are the same, and widths of the respective branch structures 112 gradually increase and then decrease. In addition, the widths of the branch structures 112 located in the same region may not be totally different, and as long as it is satisfied that for any two variable capacitors Cvra(V) located on the same side of the first region Q1, the overlap area of patch electrode 21 and branch structure 112 of the variable capacitor Cvra(V) close to the first region Q1 is greater than or equal to that of the variable capacitance Cvra (V) away from the first region Q1. In the embodiment of the present disclosure, FIG. 5 is merely taken as an example for description.

Figure 6:
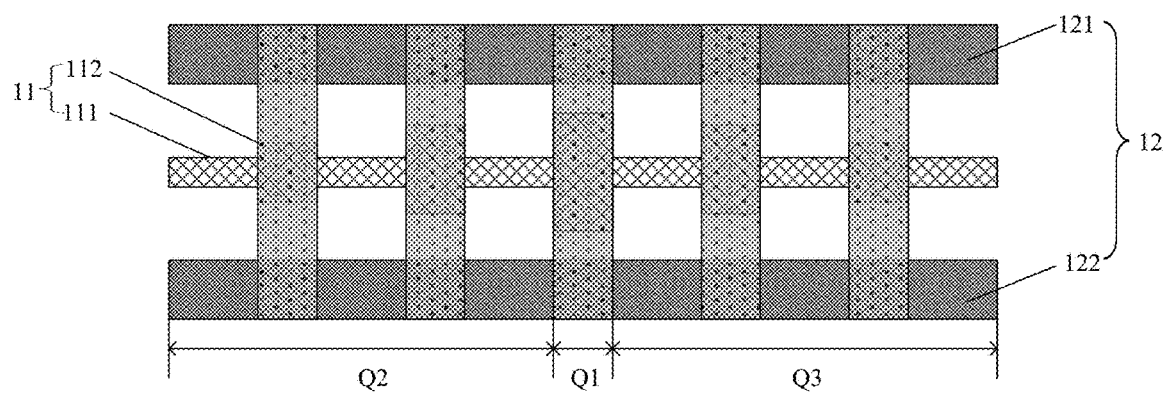
FIG. 6 is a top view of another phase shifter according to an embodiment of the present disclosure.

In some embodiments, as shown in FIG. 6, in order to realize that the overlap areas of the respective variable capacitors Cvra(V) are different, the width of each branch structure 112 may be set to be the same, and the lengths of the branch structures 112 in different variable capacitors Cvra (V) may be set to achieve that for any two variable capacitors Cvra(V) located on the same side of the first region Q1, the overlap area of patch electrode 21 and branch structure 112 of the variable capacitor Cvra(V) close to the first region Q1 is greater than or equal to that of the variable capacitance Cvra (V) away from the first region Q1.

As shown in FIG. 6, from the second region Q2 to the first region Q1 and then to the third region Q3, the widths of the respective branch structures 112 are the same, and the lengths of the respective branch structures 112 gradually increase and then decrease. In addition, the lengths of the branch structures 112 located in the same region may not be totally different, and as long as it is satisfied that for any two variable capacitors Cvra(V) located on the same side of the first region Q1, the overlap area of patch electrode 21 and branch structure 112 of the variable capacitor Cvra(V) close to the first region Q1 is greater than or equal to that of the variable capacitance Cvra (V) away from the first region Q1. In the embodiment of the present disclosure, FIG. 6 is merely taken as an example for description.

In some embodiments, the variable capacitors Cvra(V) have the same spacing therebetween. At this time, spacings d between the patch electrodes 21 may be set to a same spacing, and spacings between the branch structures 112 may also be set to a same spacing. Of course, spacings between the variable capacitors Cvra(V) (or the patch electrodes 21, or the branch structures 112) may also be designed to monotonically increase or decrease according to a certain rule. The spacings between the variable capacitors Cvra(V) (or the patch electrodes 21, or the branch structures 112) may also be designed to be different, and do not have a certain arrangement rule, which is not limited in the embodiments of the present disclosure.

In some embodiments, the first base substrate 10 and the second base substrate 20 may be a glass substrate with a thickness of 100-1000 microns, or a sapphire substrate. Alternatively, a polyethylene terephthalate substrate, triallyl cyanurate substrate, or polyimide transparent flexible substrate with a thickness of 10-500 microns may also be used. Specifically, the first base substrate 10 and the second base substrate 20 may use high-purity quartz glass with extremely low dielectric loss. Compared with an ordinary glass substrate, the use of quartz glass for the first base substrate 10 and the second base substrate 20 can effectively reduce a loss of the microwave, so that the phase shifter has a low power consumption and a high signal-to-noise ratio.

In some embodiments, the patch electrode 21, the branch structure 112, the main structure 111, and the ground electrode 12 may be formed by a metal such as aluminum, silver, gold, chromium, molybdenum, nickel, or iron.

In some embodiments, the liquid crystal molecules in the liquid crystal layer 30 are positive liquid crystal molecules or negative liquid crystal molecules. It should be noted that when the liquid crystal molecules are the positive liquid crystal molecules, in specific embodiments of the present disclosure, an angle between a long axis direction of the liquid crystal molecules and the second base substrate is greater than 0 degree, and less than or equal to 45 degrees; and when the liquid crystal molecules are negative liquid crystal molecules, in specific embodiments of the present disclosure, the angle between the long axis direction of the liquid crystal molecules and the second base substrate is greater than 45 degrees and less than 90 degrees, which ensure that the deflection of the liquid crystal molecules causes the dielectric constant of the liquid crystal layer 30 to change, thereby achieving the purpose of phase shifting.

Figure 10:
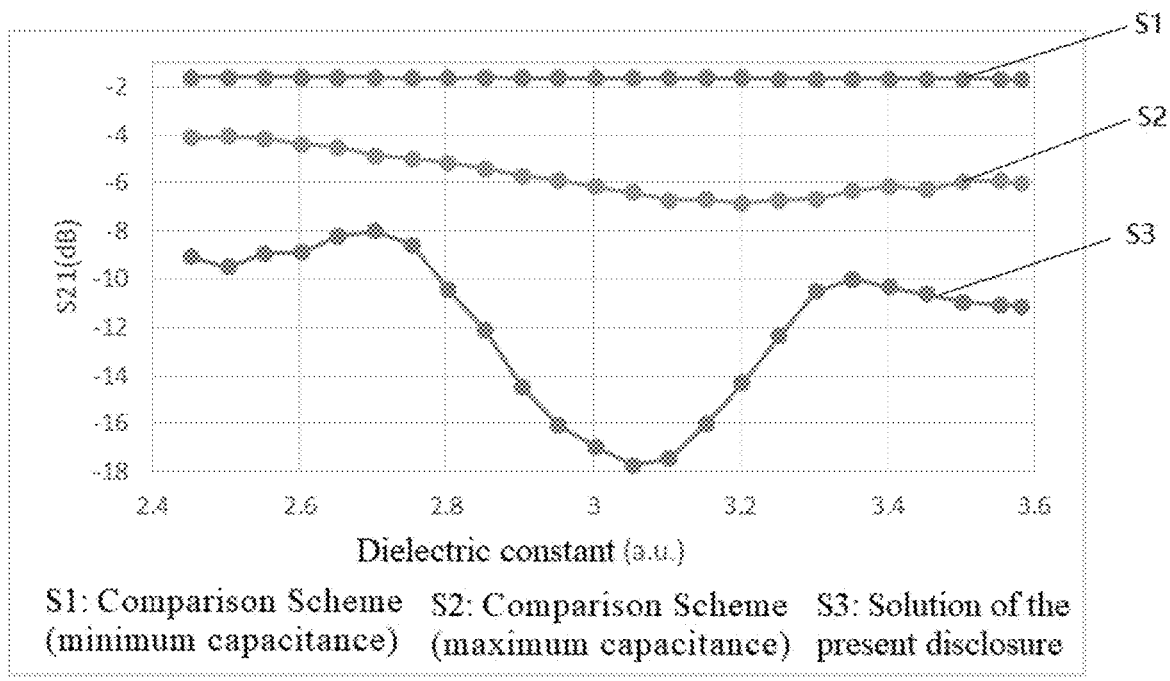
FIG. 10 is a graph of dielectric constant and transmission loss.
Figure 11:
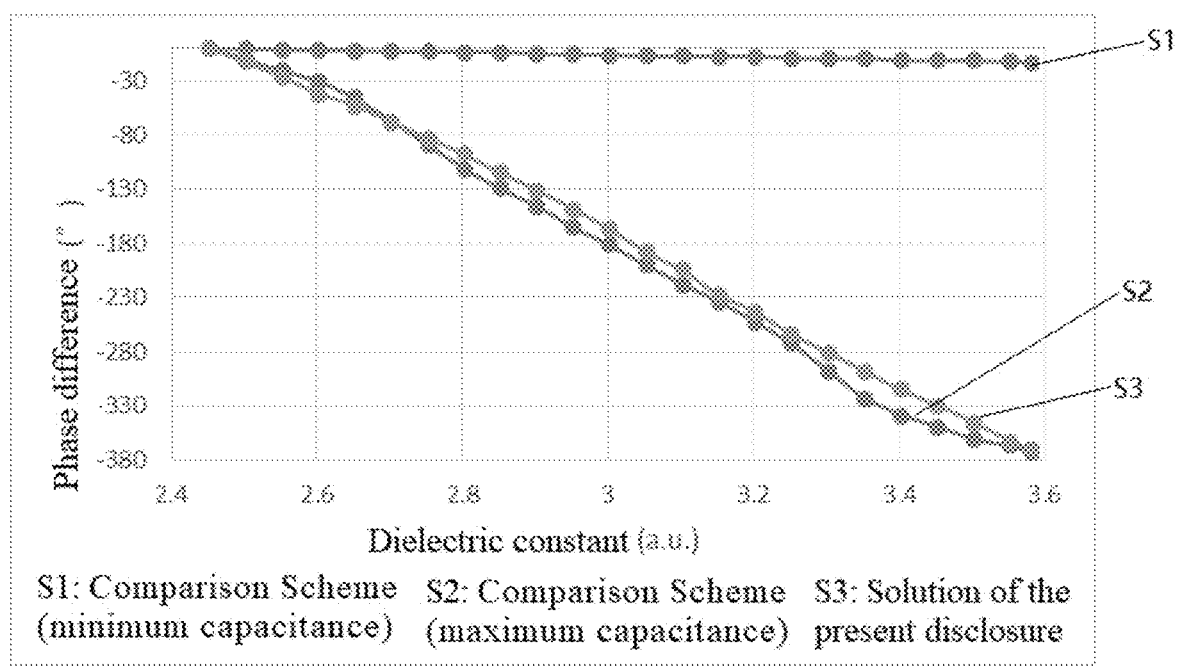
FIG. 11 is a graph of dielectric constant and phase difference.

In order to verify the effect of the phase shifter provided by the embodiments of the present disclosure, the inventor has compared transmission losses and phase differences of the phase shifter provided by the embodiments of the present disclosure, a periodically loaded maximum variable capacitance Cvra(V) phase shifter, and a periodically loaded minimum variable capacitance Cvra(V) phase shifter. The maximum variable capacitance Cvra(V) refers to a capacitance value of a variable capacitor Cvra(V) with the largest overlap area in the embodiments of the present disclosure; and the minimum variable capacitance Cvra(V) refers to a capacitance value of a variable capacitor Cvra(V) with the smallest overlap area in the embodiments of the present disclosure. As shown in FIGS. 10 and 11, FIG. 10 is a graph of dielectric constant and transmission loss, and FIG. 11 is a graph of dielectric constant and phase difference. S1 represents a comparison scheme (in which the capacitance is the minimum variable capacitance), S2 represents another comparison scheme (in which the capacitance is the maximum variable capacitance), and S3 represents the solution of the present disclosure. As shown in FIGS. 10 and 11, in the case of the same phase shift, a transmission loss range of the comparison scheme (in which the capacitance is the maximum variable capacitance) is −18 dB~−8 dB, and a span is greater than 10 dB. However, in the solution provided by the embodiments of the present disclosure, the transmission loss range is only −6.8 dB to −4 dB by means of the impedance gradually changing in each cycle, which significantly improves the consistency of the phase shifter. It should be noted here that although the transmission loss of the minimum variable capacitance is small, the phase shift range is approximately 0, and thus a phase shift degree of 360° cannot be achieved.

Figure 12:
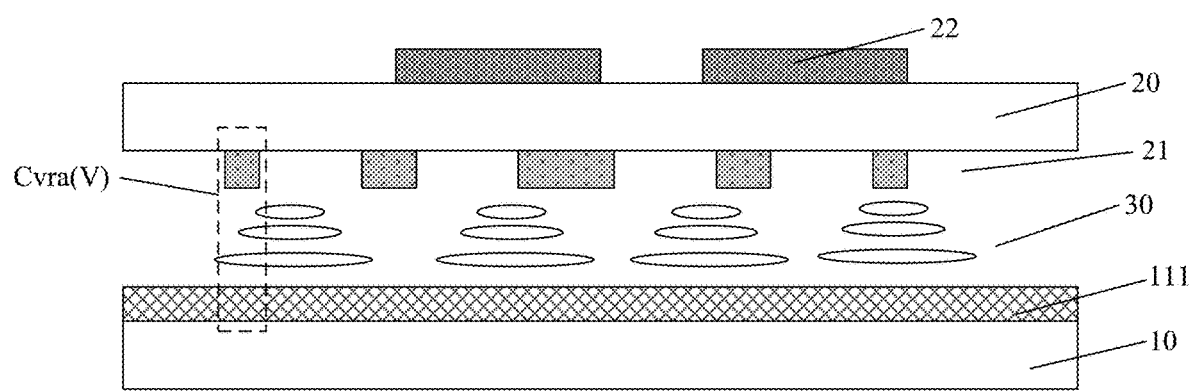
FIG. 12 is a schematic structural diagram of an antenna according to an embodiment of the present disclosure.

In a second aspect, as shown in FIG. 12, an antenna is provided by the embodiments of the present disclosure. The antenna includes the above-mentioned phase shifter. Since the antenna includes the above-mentioned phase shifter, it has a better phase shifting effect.

At least two patch units 22 are further provided on a side of the second base substrate 20 away from the liquid crystal layer 30, and a gap between every two patch units 22 is corresponding to a gap between two patch electrodes 21. In this way, the microwave signal after the phase adjustment by the above-mentioned phase shifter may be radiated from gaps between the patch units 22. Of course, the liquid crystal antenna also includes a feeding interface for feeding the microwave signal in a cable to a microwave signal transmission structure, e.g., to the main structure 111 of the signal electrode 11.

In some embodiments, the patch units 22 may be directly disposed on the second base substrate 20. That is, the patch units 22 are in contact with the second base substrate 20. In this way, an overall thickness of the antenna can be reduced, and the microwave signal can be fed into the liquid crystal layer 30 through only one layer of the second base substrate 20, thereby reducing the loss of the microwave signal. Of course, the patch units 22 may also be arranged on a separate base substrate which may be attached to the side of the second base substrate away from the liquid crystal layer 30.

It can be understood that the above implementations are merely exemplary implementations used to illustrate the principle of the present disclosure, but the present disclosure is not limited thereto. For those of ordinary skill in the art, various modifications and improvements can be made without departing from the spirit and essence of the present disclosure, and these modifications and improvements also fall within the protection scope of the present disclosure.

The invention claimed is:

1. A phase shifter, comprising: a first substrate and a second substrate arranged opposite each other, and a medium layer arranged between the first substrate and the second substrate; wherein
   the first substrate comprises: a first base substrate, and a reference electrode and a signal electrode which are arranged on a side of the first base substrate close to the medium layer; and the signal electrode comprises: a main structure and a plurality of branch structures connected to the main structure along a length direction of the main structure;
   the second substrate comprises: a second base substrate, and a plurality of patch electrodes arranged on a side of the second base substrate close to the medium layer; the plurality of patch electrodes are arranged in a one-to-one correspondence with the plurality of branch structures to form a plurality of variable capacitors; and an orthographic projection of each of the plurality of patch electrodes on the first base substrate at least partially overlaps with an orthographic projection of the reference electrode on the first base substrate;
   the phase shifter has a first region, and a second region and a third region which are respectively provided on two sides of the first region; wherein each variable capacitor located in the second and third regions has a smaller overlap area of patch electrode and branch structure than a variable capacitor located in the first region, and the variable capacitor located in the first region has only one kind of overlap area; and
   when the second region has multiple variable capacitors and the third region has multiple variable capacitors, for any two of variable capacitors located on a same side of the first region, a variable capacitor close to the first region has a greater overlap area of patch electrode and branch structure than a variable capacitor away from the first region, or has a same overlap area of patch electrode and branch structure as the variable capacitor away from the first region.

2. The phase shifter of claim 1, wherein the reference electrode comprises: a first sub-reference electrode and a second sub-reference electrode; the signal electrode is arranged between the first sub-reference electrode and the second sub-reference electrode; and the orthographic projection of each of the plurality of patch electrodes on the first base substrate at least partially overlaps with an orthographic projection of the first sub-reference electrode on the first base substrate and an orthographic projection of the second sub-reference electrode on the first base substrate.

3. The phase shifter of claim 1, wherein the variable capacitors located in the second region have different overlap areas of patch electrode and branch structure; and/or
the variable capacitors located in the third region have different overlap areas of patch electrode and branch structure.

4. The phase shifter of claim 1, wherein the number of the variable capacitors located in the second region is a same as the number of the variable capacitors located in the third region, and the variable capacitors located in the second region and the variable capacitors located in the third region are symmetrically arranged with reference to the first region.

5. The phase shifter of claim 1, wherein the variable capacitors located in the second region have monotonically increased overlap areas of patch electrode and branch structure, along a direction towards the first region; and/or
the variable capacitors located in the third region have monotonically increased overlap areas of patch electrode and branch structure, along a direction towards the first region.

6. The phase shifter of claim 1, wherein the first region has only one variable capacitor, and a phase shift degree of the phase shifter is greater than or equal to 360°.

7. The phase shifter of claim 1, wherein the first region has multiple variable capacitors, and a phase shift degree of the phase shifter is greater than or equal to 360°.

8. The phase shifter of claim 1, wherein the plurality of branch structures have a same width; or the plurality of branch structures have a same length.

9. The phase shifter of claim 1, wherein any two adjacent variable capacitors have a same spacing.

10. The phase shifter of claim 1, wherein the plurality of branch structures penetrate the main structure.

11. The phase shifter of claim 1, wherein the plurality of branch structures and the main structure are integrally formed.

12. The phase shifter of claim 1, wherein the reference electrode is a ground electrode.

13. The phase shifter of claim 1, wherein the medium layer comprises liquid crystal molecules.

14. An antenna comprising the phase shifter of claim 1.

15. The antenna of claim 14, wherein the antenna further comprises at least two patch units arranged on a side of the second base substrate away from the medium layer, and a gap between two patch units corresponds to a gap between two patch electrodes.

16. The antenna of claim 15, wherein the at least two patch units are in contact with the second base substrate.

17. The phase shifter of claim 2, wherein the variable capacitors located in the second region have different overlap areas of patch electrode and branch structure; and/or
the variable capacitors located in the third region have different overlap areas of patch electrode and branch structure.

18. The phase shifter of claim 2, wherein the number of the variable capacitors located in the second region is a same as the number of the variable capacitors located in the third region, and the variable capacitors located in the second region and the variable capacitors located in the third region are symmetrically arranged with reference to the first region.

19. The phase shifter of claim 2, wherein the variable capacitors located in the second region have monotonically increased overlap areas of patch electrode and branch structure, along a direction towards the first region; and/or
the variable capacitors located in the third region have monotonically increased overlap areas of patch electrode and branch structure, along a direction towards the first region.

20. The phase shifter of claim 1, wherein the first region has only one variable capacitor, and a phase shift degree of the phase shifter is greater than or equal to 360°; or
the first region has multiple variable capacitors, and a phase shift degree of the phase shifter is greater than or equal to 360°.

* * * * *